United States Patent
Sariaslani et al.

(10) Patent No.: US 10,718,804 B2
(45) Date of Patent: Jul. 21, 2020

(54) SYSTEM FOR MEASURING RESIDUAL PHASE NOISE

(75) Inventors: Dara Sariaslani, Santa Rosa, CA (US); Joel P. Dunsmore, Sebastopol, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 2521 days.

(21) Appl. No.: 13/362,639

(22) Filed: Jan. 31, 2012

(65) Prior Publication Data

US 2013/0197848 A1 Aug. 1, 2013

(51) Int. Cl.
*G01R 29/26* (2006.01)

(52) U.S. Cl.
CPC .................. *G01R 29/26* (2013.01)

(58) Field of Classification Search
CPC .................................. G01R 29/26
USPC .............................. 702/111, 121
See application file for complete search history.

(56) References Cited

U.S. PATENT DOCUMENTS

| | | | |
|---|---|---|---|
| 5,412,325 A * | 5/1995 | Meyers | G01R 29/26 324/613 |
| 6,480,006 B1 * | 11/2002 | Buckley | G01R 29/26 324/613 |
| 7,155,171 B2 | 12/2006 | Ebert et al. | |
| 2005/0031029 A1 * | 2/2005 | Yamaguchi | G01R 29/26 375/226 |
| 2008/0284525 A1 | 11/2008 | Williams | |
| 2010/0156438 A1 | 6/2010 | Gorin et al. | |

OTHER PUBLICATIONS

Chinese Office Action with English translation dated Sep. 22, 2016.
Notification of the Decision to Grant a Patent Right from the People's Republic of China Patent Office for Serial No. 201210590120.2 dated May 2, 2017.

* cited by examiner

*Primary Examiner* — Stephanie E Bloss

(57) ABSTRACT

A system for measuring residual phase noise of a device under test (DUT) includes first and second signal sources, first and second receivers, and a processor. The first signal source generates a first signal to be input to the DUT as a stimulus signal and provides a second signal that is phase coherent with the first signal. The second signal source receives the second signal and generates a reference signal based on the second signal, which is phase coherent with the stimulus signal. The first receiver measures an output signal from the DUT responsive to the stimulus signal, and the second receiver measures the reference signal from the second signal source. The processor mathematically suppresses a carrier of the output signal by determining a difference between the measured output signal and the measured reference signal, and determines the residual phase noise of the DUT based on the difference.

7 Claims, 10 Drawing Sheets

SYSTEM FOR MEASURING RESIDUAL PHASE NOISE

BACKGROUND

Residual or additive phase noise is a measure of noise added to an input signal by a two-port device under test (DUT), such as an amplifier, mixer, frequency converter, multiplier, and the like. Residual phase noise measurements start from the same basic principle. A component is driven by a sinusoidal signal source, and then the noise contributed by the signal source is cancelled out, leaving the noise contributed by the DUT.

FIG. 1 is a simplified block diagrams showing a conventional test setup for measuring residual phase noise.

More particularly, FIG. 1 depicts conventional system 100 signal, including signal source 110 for generating a stimulus signal, which is divided into first and second signals by splitter 115. The first and second signals are phase coherent since they are provided by the same signal source 110. The first signal is provided to DUT 105 on a first path, which includes first attenuator 121 and second attenuator 122. The second signal is provided to a second path, which includes mechanical phase shifter 130 for shifting the phase of the second signal approximately 180 degrees in relation to the first signal. The first and second signals are added at mixer 140, which physically cancels the carrier, leaving residual phase noise introduced by the DUT 105. For example, the first and second signals are supplied as the radio frequency (RF) and the local oscillator (LO) of the mixer 140, resulting in an intermediate frequency (IF) signal output at DC as close to zero as possible.

The IF signal is amplified by low noise amplifier (LNA) 150 and converted to digital data by analog-to-digital converter (ADC) 160. The DC centered spectrum of the IF signal may then be measured using a low frequency spectrum analyzer (not shown) to identify spurious signals (e.g., residual phase noise) above a predetermined level with a specified span of the DC IF.

Conventional residual phase noise measurement techniques have various drawbacks. For example, the phase shifter 130 would typically not be broadband. It is therefore difficult to design test systems capable of measuring the residual phase noise on broadband devices, such as a broadband amplifiers and converters. Also, there are fewer options for programmable phase shifters, further complicating design of an automated system.

In addition, conventional residual phase noise measurement techniques require that the mixer 140 (i.e., the phase detector) be a double balanced mixer. That is, the first and second paths provide signals driving the LO and RF ports of the mixer 140, respectively, and baseband analysis is made at the DC coupled IF port of the mixer 140. Although the mixer 140 thus may be used as the phase detector, this is typically not an application specified by manufacturers, resulting in significant trial and error efforts in locating appropriate parts. Also, diode selection, port isolation and IF circuit topology of the mixer 140 all affect performance. It is best to drive the mixer 140 under recommended power conditions, which typically means driving the LO port at approximately 13 dBm (driving an LO from 10 to 16 dBm is typical for a mixer specified at 13 dBm), and driving the RF port of the mixer 140 at approximately 5 dB lower than the LO port. A higher power level at the RF port provides more sensitivity in measurements, but only up to a certain point. At higher RF drive levels, the mixer 140 may add additional shot noise, ultimately masking the residual phase noise measurement.

Conventional residual phase noise measurement techniques further require an additional calibration step to relate the measured Vrms from the phase detector (e.g., mixer 140) to the added noise in dBm/Hz. Also, two different detectors, a voltmeter to determine quadrature and a baseband FFT based detector are needed for conducting measurements. Accordingly, more efficient means are needed for determining residual phase noise.

SUMMARY

In a representative embodiment, a system for measuring residual phase noise of a device under test (DUT) includes first and second signal sources, first and second receivers The first signal source is configured to generate a first signal to be input to the DUT as a stimulus signal and to provide a second signal that is phase coherent with the first signal. The second signal source is configured to receive the second signal and to generate a reference signal based on the second signal, the reference signal being phase coherent with the stimulus signal. The first receiver is configured to receive and measure an output signal from the DUT responsive to the stimulus signal. The second receiver is configured to receive and measure the reference signal from the second signal source. The processor is configured to receive the measured output signal from the first receiver and the measured reference signal from the second receiver, to mathematically suppress or cancel a carrier of the output signal by determining a difference between the measured output signal and the measured reference signal, and to determine the residual phase noise of the DUT based on the difference.

In another representative embodiment, a computer readable medium stores code, executable by a processor, for measuring residual phase noise of a DUT, the DUT providing an output signal responsive to a stimulus signal. The computer readable medium includes receiving code for receiving measurements of the output signal from a first receiver and measurements of a reference signal from a second receiver, the reference signal being phase coherent with the output signal; difference determining code for mathematically determining a difference between the output signal and the reference signal based on the received measurements of the output signal and the reference signal; and determining code for determining the residual phase noise of the DUT based on the difference between the output signal and the reference signal.

In another representative embodiment, a system for determining residual phase noise of a DUT includes a signal source, first and second receivers, and a processor. The signal source is configured to generate a stimulus signal to be input to the DUT. The first receiver is configured to receive and measure the stimulus signal input to the DUT. The second receiver is configured to receive and measure an output signal from the DUT responsive to the stimulus signal. The processor is configured to receive the measured stimulus signal from the first receiver and the measured output signal from the second receiver, to determine actual gain of the DUT using the measured stimulus signal and the measured output signal, to determine an ideal output signal of the DUT based on a product of the actual gain of the DUT and the measured stimulus signal, to determine residual noise power based on a difference between the ideal output signal and the output signal, and to determine residual phase noise by normalizing the residual noise power.

In another representative embodiment, a computer readable medium stores code, executable by a processor, for measuring residual phase noise of a DUT, the DUT providing an output signal responsive to a stimulus signal. The computer readable medium includes gain determining code for determining actual gain of the DUT in response to a stimulus signal provided by a signal source and input to the DUT; receiving code for receiving measurements of the stimulus signal from a first receiver and measurements of an output signal, output by the DUT in response to the stimulus signal, from a second receiver; determining code for determining an ideal output signal of the DUT based on a product of the actual gain of the DUT and the measured stimulus signal; noise power determining code for determining residual noise power based on a difference between the ideal output signal and the measured output signal; and phase noise determining code for determining residual phase noise based on the residual noise power.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Figure 1:
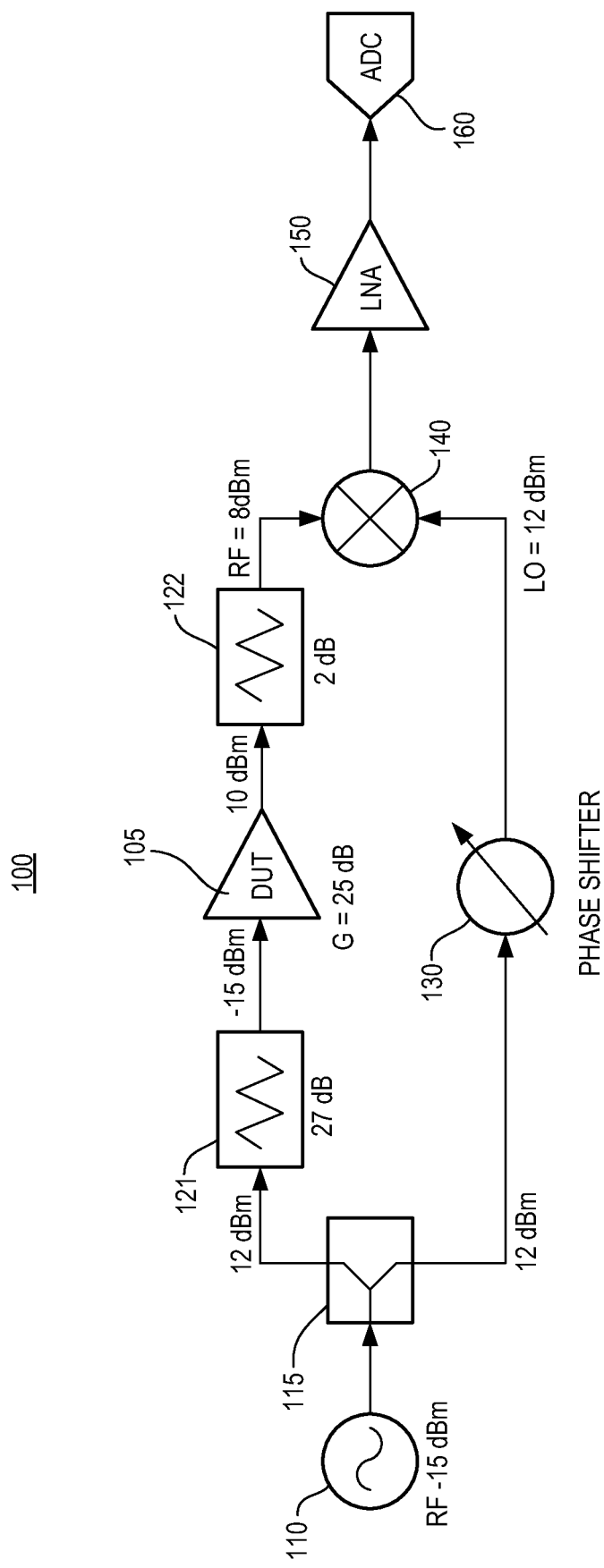
FIG. 1 is a simplified block diagram illustrating a conventional system for measuring residual phase noise of a device under test (DUT).
Figure 2:
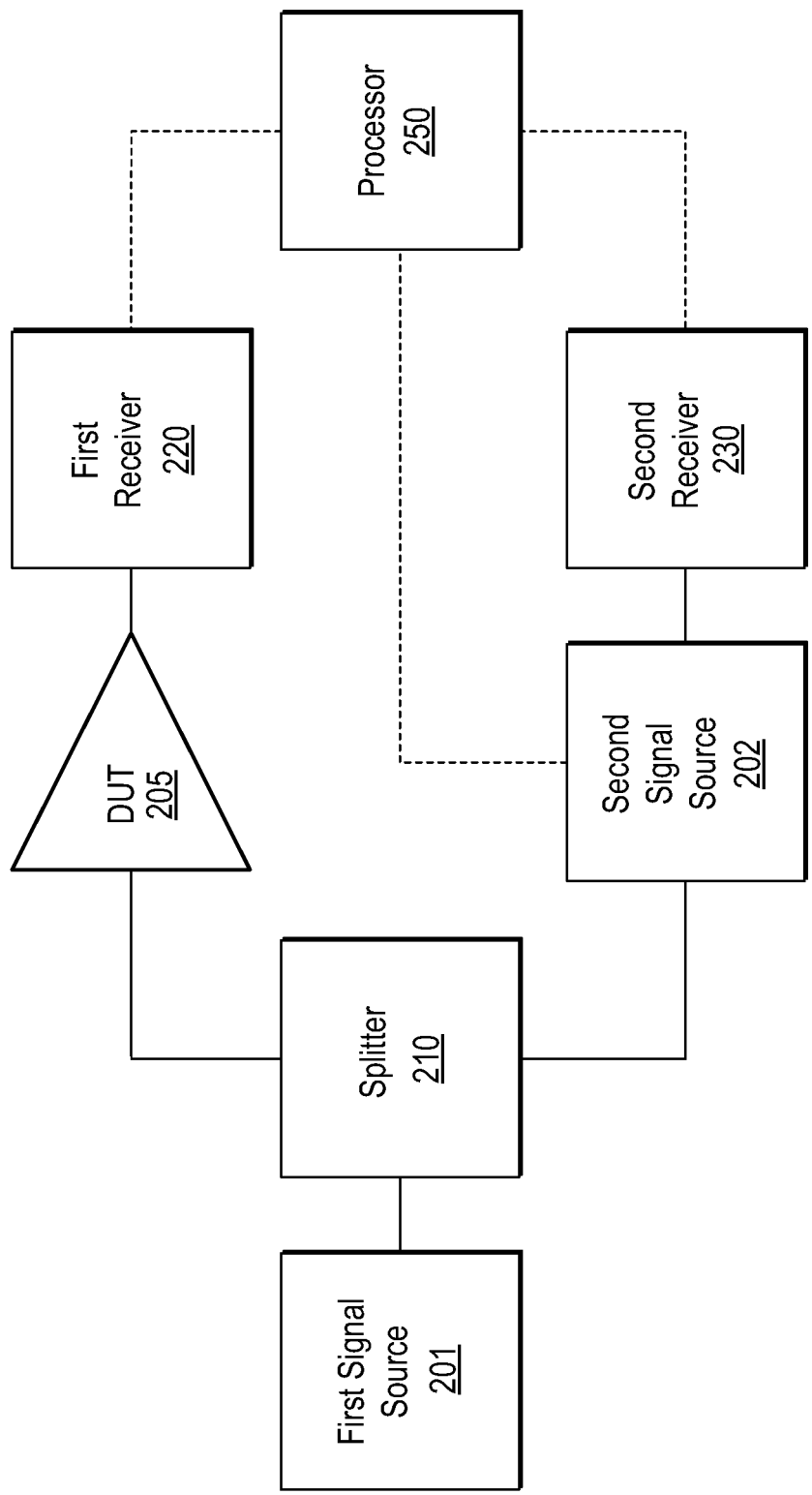
FIG. 2 is a simplified block diagram illustrating a system for measuring residual phase noise of a DUT, according to a representative embodiment.

FIG. 2 is a simplified block diagram illustrating a system for measuring residual phase noise of a DUT, according to a representative embodiment.

Referring to FIG. 2, system 200 includes first signal source 201, second signal source 202 and splitter 210, which divides a signal generated by the first signal source 202 into first and second signals. The first signal is input to DUT 205 as a stimulus signal, and the DUT 205 provides an output signal responsive to the stimulus signal indicating response characteristics of the DUT 205. The second signal, which is phase coherent with the first signal, is input to the second signal source 202 as a driving signal. The second signal source 202 is configured to generate a reference signal based on the second signal, where the reference signal is likewise phase coherent with the stimulus signal. The second signal source 202 is further able to dynamically adjust phase and magnitude of the reference signal (which maintains phase coherency with the stimulus signal). In alternative embodiments, the first signal source 201 have two or more outputs for providing both the first and second seconds, which are identical and phase coherent, thus eliminating the need for the splitter 210.

The system 200 further includes first receiver 220, second receiver 230 and processor 250. The first receiver 220 is configured to receive the output signal from the DUT 205, and to measure at least the phase and magnitude (amplitude) of the output signal. The second receiver 230 is configured to receive the reference signal from the second signal source 202, and to measure at least the phase and magnitude of the reference signal. In various embodiments, the first and second receivers 220 and 230 respectively receive and measure the output signal and the reference signal substantially simultaneously.

The processor 250 is configured to receive the measurements of the output signal and the reference signal from the first and second receivers 220 and 230, and to compare the phases and magnitudes of the output signal and the reference signal based on the measurements. In response to the comparisons, the processor 250 causes the second signal source 202 to adjust the phase and magnitude of the reference signal such that the phase of the reference signal is about 180 degrees out of phase with the phase of the output signal and the magnitude of the reference signal is approximately equal to the magnitude of the output signal.

The first receiver 220 continues to receive and measure the output signal, and the second receiver 230 continues to receive and measure the (adjusted) reference signal. Likewise, the processor 250 continues to receive the measurements of the output signal and the reference signal. The processor 250 is further configured to mathematically suppress or cancel the carrier of the output signal by determining the sum between the measured output signal and the measured reference signal. For example, the processor 250 may add the output signal and the reference signal, which is about 180 degrees out of phase and substantially equal in magnitude to the output signal. The remaining signal provides the residual phase noise of the DUT 205.

Because the operations of the processor 250 are mathematical, there is no need to physically mix the output signal with another signal, or to physically cancel the carrier of the output signal in order to detect the residual phase noises.

This eliminates the need for various signal processing components, such as mixers (e.g., mixer 140), amplifiers (e.g., LNA 150), converters (e.g., ADC 160), and the like. Determining the difference between the measured output signal and the measured reference signal effectively suppresses the carrier of the output signal, e.g., about 50-60 dB of cancellation.

Figure 3:
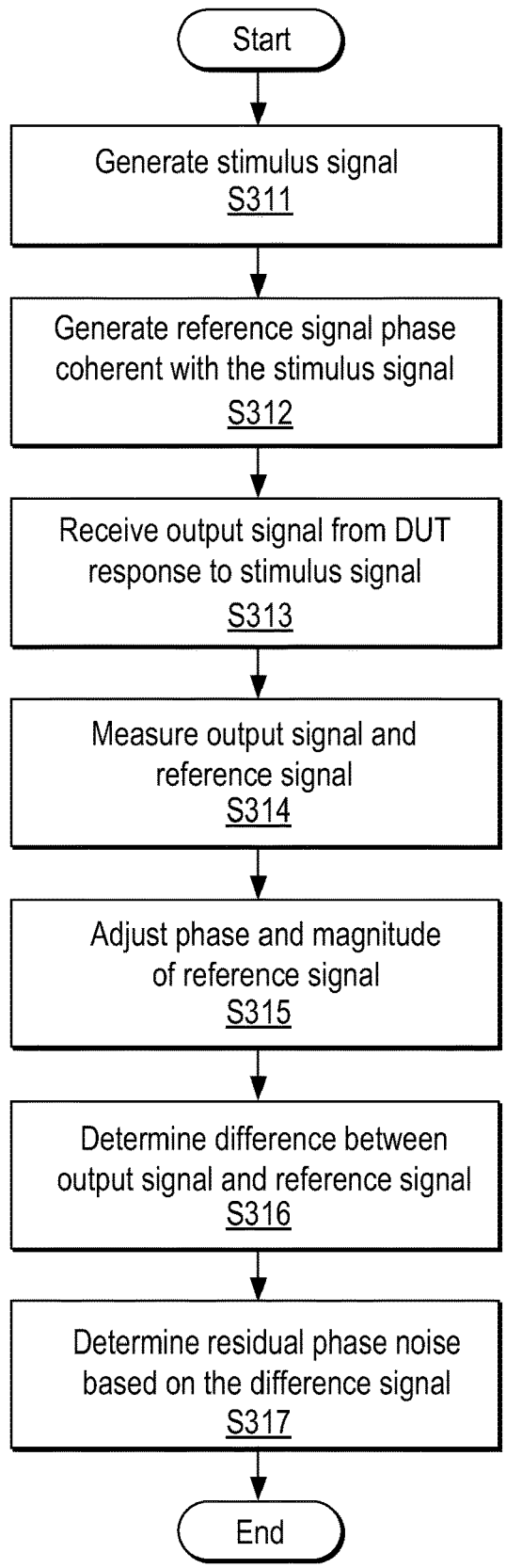
FIG. 3 is a flow diagram illustrating a method for measuring residual phase noise of a DUT, according to a representative embodiment.

FIG. 3 is a flow diagram illustrating a method for measuring residual phase noise of a DUT, according to a representative embodiment.

The various operations depicted in FIG. 3 may be implemented in whole or in part by a processing device, such as processor 250 in FIG. 2 and/or processor 921 in representative controller 950, discussed below with reference to FIG. 9. The processing device may be included in a VNA or other measurement instrument, such as a vector spectrum analyzer or an oscilloscope, for example, or may be a separate device. In various alternative embodiments, the processing device may be implemented by a processor, application specific integrated circuits (ASICs), field-programmable gate arrays (FPGAs), or combinations thereof, using software, firmware, hard-wired logic circuits, or combinations thereof. When using a processor, a memory is included for storing executable software/firmware and/or executable code that allows it to perform the various functions.

Referring to FIG. 3, a stimulus signal is generated in block S311 and provided to a DUT. The stimulus signal includes a carrier at a carrier frequency. A reference signal, which is phase coherent with the stimulus signal, is generated in block S312. The reference signal has the same carrier and carrier frequency as the stimulus signal. Phase coherency between the reference signal and the stimulus signal may be accomplished in a number of ways. For example, the stimulus signal may be generated by a first signal source (e.g., first signal source 201) and divided into two phase coherent signals, one of which is the stimulus signal, and the other of which is the reference signal or is used to generate the reference signal by a second signal source (e.g., first signal source 202). Alternatively, the first signal source may have multiple outputs for simultaneously generating first and second signals, as discussed below with reference to FIG. 4. This may be the case, for example, when the first signal source is one of two internal signal sources of a vector network analyzer (VNA), such as a PNA N522xA network analyzer or a PNA-X N524xA network analyzer, for example, available from Agilent Technologies, Inc., where each of the internal signal sources is capable of outputting two or more phase coherent signals (but is not capable of phase shifting one of the signals with respect to the other). The first signal is the stimulus signal, while the second signal drives a second signal source that generates the reference signal. Because the second signal source is driven by the second signal, the reference signal generated by the second signal source is phase coherent with the first signal (i.e., the stimulus signal), yet the reference signal can be independently phase adjusted with regard to the first signal, since the second signal source is separate from the first signal source.

In block S313, an output signal is received from the DUT responsive to the stimulus signal generated in block S311. The output signal has the same carrier and carrier frequency as the stimulus signal (as well as the reference signal). Also, the output signal indicates the DUT's response to the stimulus signal, e.g., when the DUT is an amplifier, a switch, a filter, or the like, for example. The output signal and the reference signal are measured in block S314. The output signal and the reference signal may be measured using dedicated receivers (e.g., first and second receivers 220, 230), in which case the measurements may be performed substantially simultaneously. The receivers may be separate receivers configured within a VNA, for example.

In block S315, the phase and magnitude of the reference signal are adjusted based on the measurements of the output signal. In particular, the phase of the reference signal is adjusted so that it is about 180 degrees out of phase with the output signal, and the magnitude of the reference signal is adjusted to be sufficiently equal to the magnitude of the output signal to suppress (or cancel) the carrier of the output signal when the reference signal is about 180 degrees out of phase.

In block S316, the difference between the measured output signal and the (adjusted) measured reference signal is determined. The difference is calculated mathematically by a processor (e.g., processor 250), for example, so that no physical mixing of the output signal and the reference signal takes place. The residual phase noise introduced by the DUT may then be determined in block S317, where the residual phase noise is provided by the remaining signal. The residual phase noise in the output signal is much closer in magnitude to the suppressed fundamental signal. That is, the residual phase noise may be slightly lower, the same or even higher in magnitude than the suppressed fundamental signal, but the residual phase noise is unaltered, as well as easily identified and measured.

As mentioned above, in an embodiment, the stimulus signal may be provided by an internal signal source of a VNA, and the reference signal may be provided by an external signal generator driven by a signal phase coherent with the stimulus signal. Alternatively, the reference signal may be provided by another internal source of the VNA, for example, similarly driven by the stimulus signal, to the extent the configuration of the VNA allows. The type and location of the signal generators/sources may vary without departing from the scope of the present teachings. Also, in an alternative embodiment, the output signal and the reference signal may be measured by the same receiver, to assure that the corresponding frequencies and magnitudes match, and that the corresponding phases are opposite.

Figure 4:
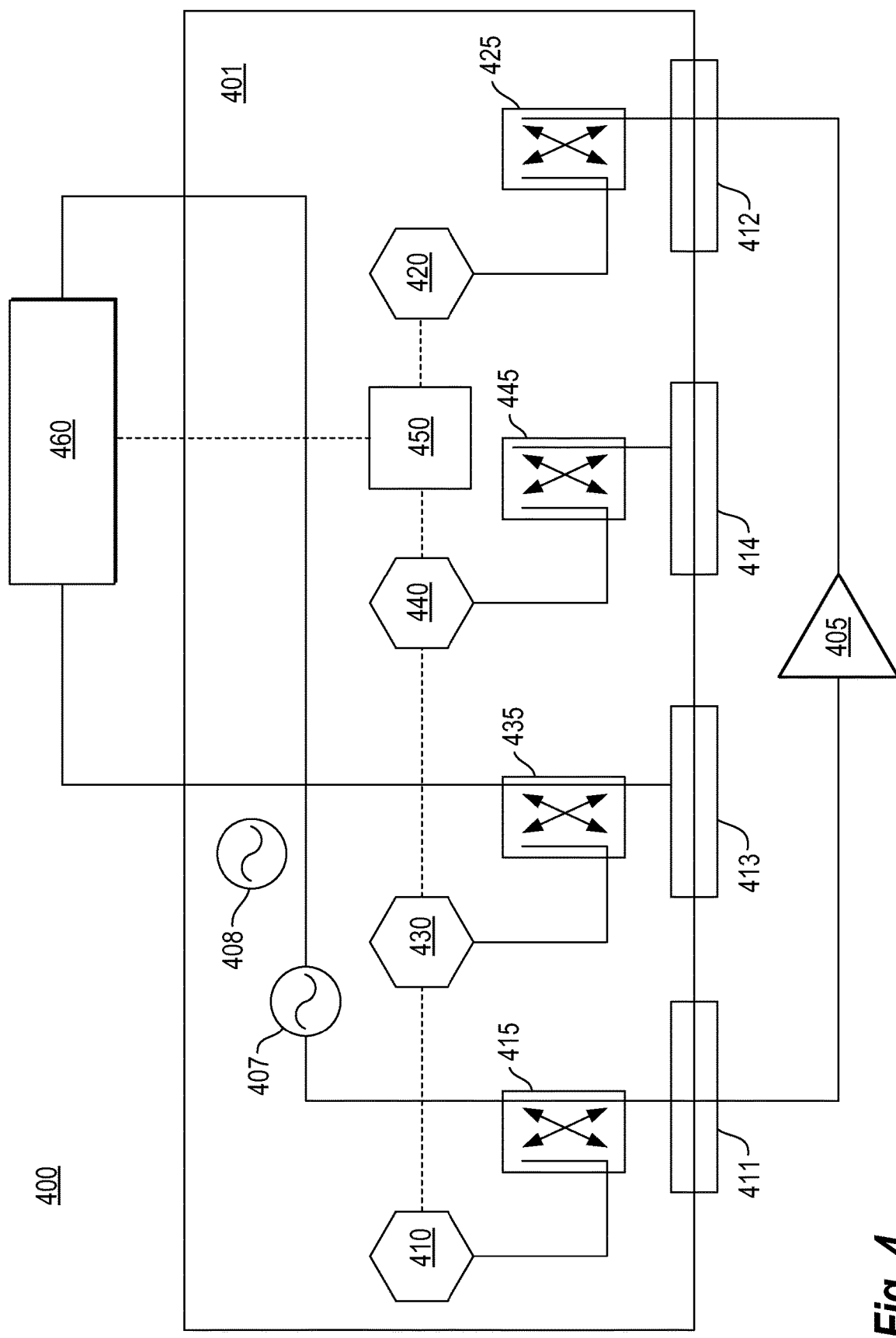
FIG. 4 is a simplified block diagram illustrating a system for measuring residual phase noise of a DUT, according to a representative embodiment.

FIG. 4 is a simplified block diagram illustrating a system for measuring residual phase noise of a DUT, according to a representative embodiment.

Referring to FIG. 4, system 400 includes illustrative vector network analyzer (VNA) 401, which receives and processes an output signal from DUT 405, and signal generator 460. The VNA 401 has four test ports, and may be a PNA N522xA network analyzer or a PNA-X N524xA network analyzer, for example, available from Agilent Technologies, Inc., and the signal generator 460 may be an MXG 518xA signal generator or a PSG E82x7D signal generator, for example, also available from Agilent Technologies, Inc. FIG. 4 depicts one illustrative implementation, and it is otherwise understood that the various components and functions may be implemented using any type of signal generator and/or measurement receiver, such as a two test port network analyzer, a vector spectrum analyzer, an oscilloscope, and the like.

In the depicted example, the VNA 401 includes two internal signal sources, signal source 407 and signal source 408, as well as first through fourth test ports 411-414 (each having multiple connections). Each of the first through fourth test ports 411-414 enables connection to one or more internal receivers and couplers, of which representative receivers 410, 420, 430 and 440 and corresponding couplers 415, 425, 435 and 445 are shown, respectively. As previously discussed, each of the signal sources 407 and 408 has two outputs configured to output the same signal. The two signals from the signal source 407 or the signal source 408 are phase coherent with one another, but their relative phases cannot be altered. Also, the signals output by the signal source 407 are not phase coherent with the signals output by the signal source 408. The couplers 415, 425, 435 and 445 may be directional couplers, for example, although other devices for removing and/or combining various signals may be incorporated without departing from the scope of the present teachings.

For purposes of discussion, it is assumed that the signal source 407 of the VNA 401 provides a stimulus signal to an input of the DUT 405 and a driving signal to an input of the signal generator 460 for generating a reference signal. In other words, the signal source 407 generates first and second signals which are identical to one another and phase coherent. The first signal is the stimulus signal that is input to the DUT 405 and the second signal is the driving signal that is input to the signal generator 460. Each of the first and second signals may be a continuous wave (CW) signal including the same carrier. The output signal output by the DUT 405 in response to the first (stimulus) signal likewise includes the same carrier, as well as residual phase noise introduced by the DUT 405 in response to the stimulus signal, discussed below. In the depicted example, the first signal is input to the DUT 405 via first test port 411 and the second signal is injected into the signal generator 460 via second test port 412.

Of course, in alternative embodiments, the signal source 408 may generate the stimulus signal and the driving signal. Alternatively, the phase coherent stimulus signal and driving signal may be generated by an external signal generator, which has two outputs like the signal sources 407 and 408, or which has one output connected to a splitter, which splits the generated signal into the phase coherent stimulus and driving signals, as discussed above with reference to FIG. 2.

The output signal output by the DUT 405 is received and sampled by an internal receiver, such as representative receiver 420, via another connection at second test port 412 and coupler 425 of the VNA 401. An attenuator (not shown) may be included in the signal path between the DUT 405 and the receiver 420, in case attenuation is desired. The receiver 420 is able to measure characteristics of the output signal including phase and magnitude, the output signal indicating the response of the DUT 405 to the first (stimulus) signal provided by the signal source 407. The receiver 420 provides the measurements to the controller 450. Although depicted as being internal to the VNA 401, it is understood that the controller 450 may be included in any of various external computer processing devices, a person computer (PC), a laptop computer, other test instrumentation, and the like, without departing from the scope of the present teachings. Also, it is understood that receiver 420 is identified for purposes of explanation, and that the output signal may be received and sampled by any other internal receiver via a corresponding test port, without departing from the scope of the present teachings.

Meanwhile, the signal generator 460 generates the reference signal in response to the second (driving) signal provided by the signal source 407. In an embodiment, the signal generator 460 includes an input loop (not shown), such that a signal (e.g., the reference signal) generated by the signal generator 460 at the same carrier frequency as a signal (e.g., the second signal) injected into the input loop is phase coherent with the injected signal. For example, a PSG E8267D signal generator, available from Agilent Technologies, Inc., includes an "HCC option," which enables a signal (e.g., the second signal) to be injected into one of two loops via back panel connectors, one loop for signals below 3.2 GHz and one loop for signals above 3.2 GHz. In response, any signal generated by the PSG E8267D signal generator at the same carrier frequency of the signal injected into the loop will be phase coherent with the injected signal.

The reference signal output by the signal generator 460 is received and sampled by another internal receiver, such representative receiver 430 of the VNA 401 via third test port 413 and coupler 435. The receiver 430 is able to measure characteristics of the reference signal including phase and magnitude. The receiver 430 provides the measurements to the controller 450. Notably, the receiver 430 is measuring the reference signal at the same time the receiver 420 is measuring the output signal. It is understood that receiver 430 is identified for purposes of explanation, and that the reference signal may be received and sampled by any other internal receiver via a corresponding test port, without departing from the scope of the present teachings.

The controller 450 receives the reference signal measurements and the output signal measurements, and in an embodiment, may do so continually throughout the testing process. The controller 450 causes the signal generator 460 to adjust the phase and/or magnitude of the reference signal based on the received measurements of the reference and output signals. For example, the phase of the reference signal may be adjusted so that it is about 180 degrees out of phase with the output signal, and the magnitude of the reference signal is adjusted to be sufficiently equal to the magnitude of the output signal to suppress (or cancel) the fundamental signal of the output signal when the reference signal is about 180 degrees out of phase.

The signal generator 460 may adjust the phase and/or magnitude of the reference signal under control of the controller 450 using a variety of means. For example, the signal generator 460 may include IQ modulation functionality, enabling the signal generator 460 to shift the phase and magnitude of the reference signal. In this case, the signal generator 460 receives an IQ file from the controller 450, representing the required offset of phase and/or magnitude based on comparison of the reference signal measurements and the output signal measurements. An IQ file for any given phase angle can be generated by the controller 450 on the fly and downloaded to the signal generator 460 using any programming environment capable of sending SCPI commands, for example.

In an embodiment, in order to adjust the phase and/or magnitude of the reference signal, the controller 450 determines the ratio of the measured output signal and the measured reference signal, respectively provided by the receiver 420 and the receiver 430. The controller 450 causes the signal generator 460 to adjust the phase and magnitude of the reference signal so that the phase of the ratio is 0 degrees and the magnitude of the ratio is 0 dBm.

Once the signal generator 460 adjusts the phase of the reference signal to be about 180 degrees out of phase with the output signal, and/or adjusts the magnitude of the reference signal to substantially equal the magnitude of the output signal, under control of the controller 450, the carrier will be effectively suppressed (or canceled) by combining the reference signal and the output signal. Therefore, the controller 450 measures the resulting spectrum, determining the difference between the output signal measured by the receiver 420 and the (adjusted) reference signal measured by the receiver 430. The difference is calculated mathematically by the controller 450, avoiding the need for physically mixing the output signal and the reference signal, as discussed above. Because of the 180 degree phase difference, determining the difference may include adding the output signal and the reference signal. The signal that remains after suppressing the carrier includes the residual phase noise introduced by the DUT 405.

Notably, the magnitude and/or the phase of the reference signal may be adjusted to suppress all of the carrier of the output signal, as discussed above, or only a portion of the carrier. For example, when the reference signal and the output signal have the same magnitude and are about 180 degrees out of phase with one another, the carrier of the output signal is completely suppressed or canceled. However, when magnitude of the reference signal is less than the magnitude of the output signal and/or the phase of the reference signal is less than 180 degrees out of phase with the phase of the output signal, then the carrier of the output signal is only partially suppressed. Of course, in various embodiments, the suppression level may be adjusted as desired.

Once the phase and magnitude of the reference signal having been adjusted, and the effects of the carrier (as well as phase noise) of the output signal have been mathematically removed, the residual phase noise may be measured by the controller 450 by simply sweeping the receiver 420 and the receiver 430 over the specified span centered at the carrier frequency of the output signal, while keeping the CW frequency fixed. In an embodiment using a PNA-X, for example, this may be accomplished using frequency offset mode (FOM). Sweep averaging may provide improved measurements of the residual phase noise. Alternatively, in an embodiment, the controller 450 may repeatedly determine multiple differences between the output signal measured by the receiver 420 and the reference signal measured by the receiver 430 in response to the sweeping. The controller 450 may then average these differences, and determine the residual phase noise of the DUT based on the averaged difference.

Also, in an embodiment using a PNA-X, measurement of the residual phase noise is made at twice the desired span centered at the carrier frequency, measuring both signal sidebands, since no assumption can be made that the negative sideband folds over the positive sideband (as when measurement is made using a spectrum analyzer using conventional techniques). For this measurement, the IF bandwidth (IFBW) of the receiver 420 should be an order of magnitude smaller than the span. For example, an IFBW of 1 KHz is sufficient for a 2 MHz span. Once the IFBW is selected, then the number of frequency points must be set, such that spacing between points is half the IFBW or less. For example, with a span of 2 MHz and an IFBW of 1 KHz, the point spacing should be less than 500 Hz, which means that there should be more than 4001 points in each sweep.

In an alternative embodiment, the controller 450 may compare the reference signal to the first (stimulus) signal, as opposed to the output signal, for adjusting the phase and magnitude of the reference signal. In this case, the first signal output by the signal source 407 is received and sampled by another internal receiver, such representative receiver 410 of the VNA 401 via first test port 411 and coupler 415, which may be a directional coupler, for example. The receiver 410 is able to measure characteristics of the first signal including phase and magnitude. The receiver 410 provides the measurements to the controller 450, which causes the signal generator 460 to adjust the phase and magnitude of the reference signal, such that the phase of the reference signal is about 180 degrees out of phase with the phase of the first signal and the magnitude of the reference signal is substantially equal to the magnitude of the first signal.

Figure 5A:
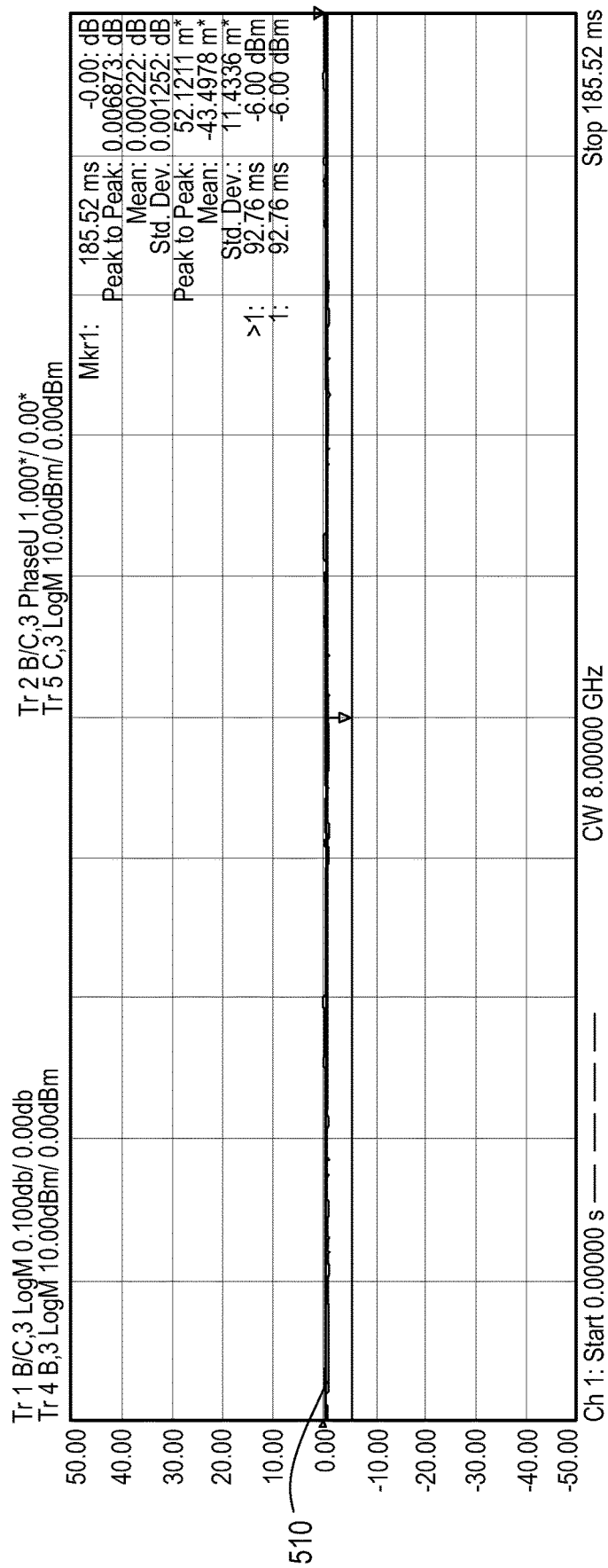
FIGS. 5A and 5B are displays showing illustrative traces of a received output signal, according to a representative embodiment.
Figure 5B:
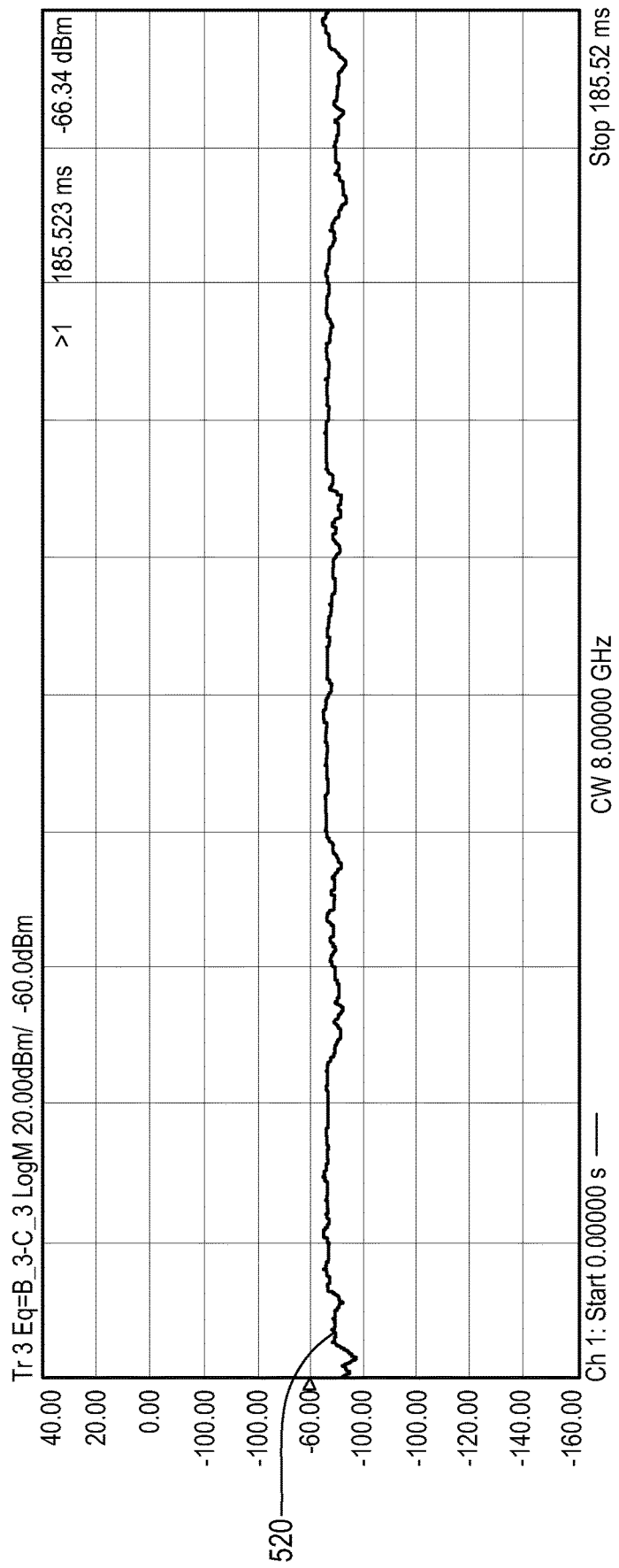

FIGS. 5A and 5B are displays showing illustrative traces of a received output signal, according to a representative embodiment. In particular, FIG. 5A shows a trace of the output signal provided a DUT with no suppression of the carrier, and FIG. 5B shows a trace of the output signal provided by the DUT with suppression of the carrier using the representative system 400 depicted in FIG. 4.

Referring to FIG. 5A, trace 510 represents an output signal received by a receiver (e.g., receiver 420 in FIG. 4), in which no suppression of the carrier has been performed. In the depicted example, the carrier has a center frequency of about 8.0 GHz. As shown in FIG. 5A, the magnitude of the output signal (e.g., from DUT 405) is about −6 dBm.

In comparison, trace 520 in FIG. 5B represents the output signal received by the receiver (e.g., receiver 420), where carrier suppression has been performed according to a representative embodiment. For example, the controller 450 has mathematically canceled the carrier in the output signal using the phase coherent reference signal provided by the signal generator 460, as discussed above. In the depicted example, the magnitude of the output signal (e.g., from DUT 405) is now about −66 dBm, indicating about 60 dB of carrier suppression. The remaining signal, indicated by trace 520, provides the residual phase noise introduced by the DUT 405.

Figure 6:
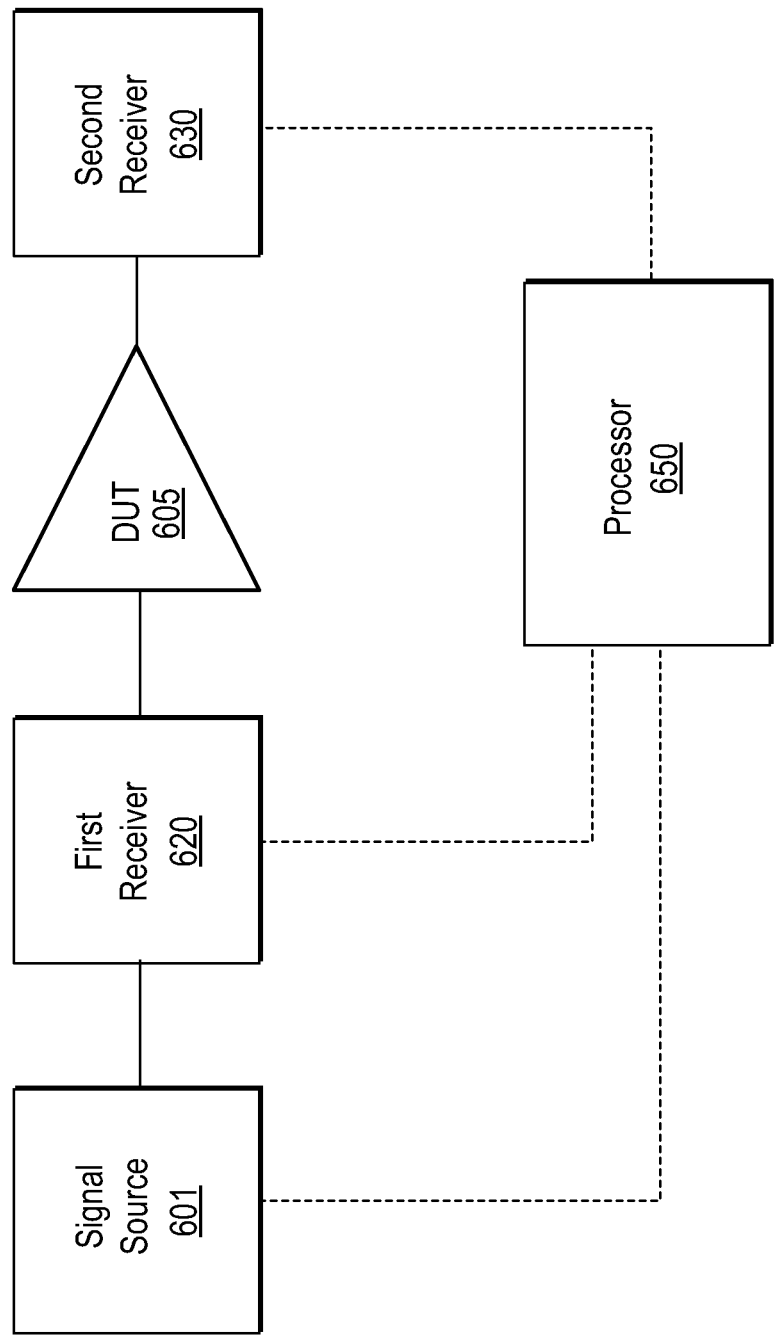
FIG. 6 is a simplified block diagram illustrating a system for measuring residual phase noise of a DUT, according to another representative embodiment.

FIG. 6 is a simplified block diagram illustrating a system for measuring residual phase noise of a DUT, according to a representative embodiment. The system depicted in FIG. 6 relies on the same basic principle of mathematically removing the input carrier and its phase noise from the DUT's output signal, so that the residual signal is the noise added by the DUT. However, the system depicted in FIG. 6 does not require two coherent signals, but rather provides for one signal generator and means to measure incident and transmitted voltage signals at the input and output of the DUT, respectively.

Referring to FIG. 6, system 600 includes signal source 601, first receiver 620, second receiver 630 and processor 650. The signal source 601 generates a stimulus input to DUT 605, and the DUT 605 provides an output signal responsive to the stimulus signal indicating response characteristics of the DUT 605. The first receiver 620 is configured to receive the stimulus signal, and to measure at least the phase and magnitude of the stimulus signal. The second receiver 630 is configured to receive the output signal from the DUT 605, and to measure at least the phase and magnitude of the output signal. In various embodiments, the first and second receivers 620 and 630 respectively receive and measure the stimulus signal and output signal substantially simultaneously.

The processor 650 is configured to receive the measurements of the stimulus signal and the output signal from the first and second receivers 620 and 630, and to mathematically suppress or cancel the carrier of the output signal by determining the difference between the measured output signal and an idealized output signal, discussed below with reference to FIG. 3, leaving the residual phase noise introduced by the DUT 605.

More particularly, in the depicted embodiment, the first and second receivers 620 and 630 are used to determine the actual gain of the DUT 605. This may be accomplished by performing a swept frequency measurement, where the signal source 201, the first receiver 620 and the second receiver 630 sweep over the full frequency span of interest, which may be set to about twice the span of the final residual phase noise measurement. The carrier frequency of the stimulus signal is at the center of the span. The processor 650 is then able to determine the actual gain (change in phase and magnitude) caused by the DUT 605, e.g., by measuring forward gain S-parameter $S_{21}$, which is the ratio of the output signal and the stimulus signal.

The respective power spectrums of the stimulus signal and the output signal are then measured. For example, the first and second receivers 620 and 630 may be used to measure the stimulus signal and the output signal, respectively, by sweeping over the full frequency span, while the signal source 601 is held constant at the center frequency. With these measurements, the processor 650 is able to calculate the "ideal" output signal, which is the measured output signal without residual phase noise (and other non-linearities) introduced by the DUT 605. For example, the ideal output signal may be determined by multiplying the measured stimulus signal by the previously determined forward gain S-parameter $S_{21}$ of the DUT 605. The processor 650 is able to calculate residual noise power by effectively subtracting the ideal output signal from the measured output signal. The processor 650 may normalize the spectrum of the residual noise power to obtain the residual phase noise using known normalization techniques, an example of which is discussed below with reference to FIG. 7.

The operations of the processor 650 are mathematical, so there is no need to physically mix the output signal with another signal, or to physically cancel the carrier of the output signal in order to detect the residual phase noises. This eliminates the need for various signal processing components, such as mixers (e.g., mixer 140), amplifiers (e.g., LNA 150), converters (e.g., ADC 160), and the like, as discussed above.

Figure 7:
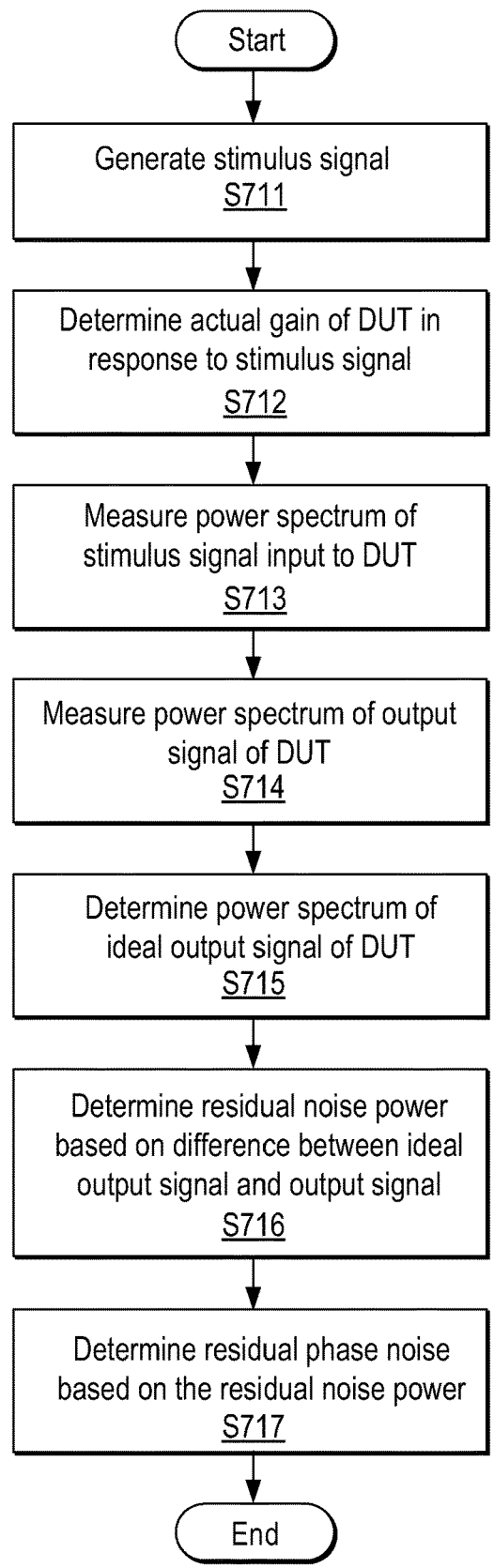
FIG. 7 is a flow diagram illustrating a method for measuring residual phase noise of a DUT, according to another representative embodiment.

FIG. 7 is a flow diagram illustrating a method for measuring residual phase noise of a DUT, according to a representative embodiment.

The various operations depicted in FIG. 7 may be implemented in whole or in part by a processing device, such as the processor 650 in FIG. 6 and/or the processor 921 in representative controller 950, discussed below with reference to FIG. 9. The processing device may be included in a VNA or other measurement instrument, such as a vector spectrum analyzer or an oscilloscope, for example, or may be a separate device. In various alternative embodiments, the processing device may be implemented by a processor, ASICs, FPGAs, or combinations thereof, using software, firmware, hard-wired logic circuits, or combinations thereof. When using a processor, a memory is included for storing executable software/firmware and/or executable code that allows it to perform the various functions.

Referring to FIG. 7, a stimulus signal is generated in block S711 and provided to a DUT. The stimulus signal includes a carrier at a carrier frequency. In block S712, the actual gain of the DUT is determined in response to application of the stimulus signal. The actual gain may be determined as the forward gain S-parameter $S_{21}$, which is the ratio of the output signal from the DUT to the stimulus signal as measured by corresponding receivers (e.g., second and first receivers 630, 620, respectively). As discussed above, in order to determine the forward gain S-parameter $S_{21}$, a swept frequency measurement is performed with the carrier frequency of interest at the center of the span, which is set to twice the span of interest for the final residual phase noise measurement.

The power spectrum of the stimulus signal input to the DUT (which may be referred to as a1) is measured in block S713, and the power spectrum of the output signal output from the DUT (which may be referred to as b2) is measured in block S714, both of which are corrected. The stimulus signal and the output signal may be measured using dedicated receivers (e.g., first and second receivers 620, 630), in which case the measurements may be performed substantially simultaneously. The receivers may be separate receivers configured within a VNA, for example. The power spectrum measurements are made without sweeping the generated stimulus signal, in order to measure the actual stimulus signal and the actual output signal. That is, the signal source is maintained at the carrier frequency of the stimulus signal. Both the stimulus signal and the output signal are phase coherent since they are generated from the same signal source. Generally, the output signal is the stimulus signal amplified and delayed by the DUT. The output signal also contains the effects of phase noise (and other non-linear effects) added by the DUT.

Generally, given this relationship between the stimulus signal and the output signal, if the stimulus signal were to be delayed and amplified (indicated by changes in phase and magnitude) the same as the output signal, it would represent an "ideal" output signal, in that it would be the output signal without phase noise. Then, as discussed above, by subtracting the ideal output signal from the measured output signal, the remaining signal would be the additive noise power of the DUT. Accordingly, a power spectrum of an ideal output signal (which may be referred to as b2') is determined in block S715, for example, by multiplying the stimulus signal a1 by the forward gain S-parameter $S_{21}$ determined in block S712.

In block S716, residual noise power is determined based on the difference between the ideal output signal determined in block S715 and the output signal measured in block S714. As mentioned above, the forward gain S-parameter $S_{21}$ contains both phase and magnitude information about the DUT. Therefore, the residual noise power may be determined using Equation (1), where a1 indicates the actual stimulus signal measured in block S713, b2 indicates the actual output signal measured in block S714, and the product of a1 and $S_{21}$ indicates the ideal output signal (b2') determined in block S715:

$$\text{Noise Power} = 20 \times \log_{10} \left| \frac{b2}{a1 \times S21} \right| \qquad (1)$$

The residual phase noise is determined in block S717 based on the residual noise power determined in block S716. For example, the residual noise power may be normalized and expressed in dBc/Hz using Equation (2), where IFBW is the IF bandwidth of the receiver configured to receive the output signal (e.g., the second receiver 630):

$$\text{Residual Phase Noise} = \text{Noise Power} - 10 \times \log_{10} FBW - 20 \times \log_{10} |b2|_{@carrier\ freq} \qquad (2)$$

The various calculations, including determination of the ideal output signal, the residual noise power and the residual phase noise, are performed by a processing device (e.g., processor 650).

Figure 8:
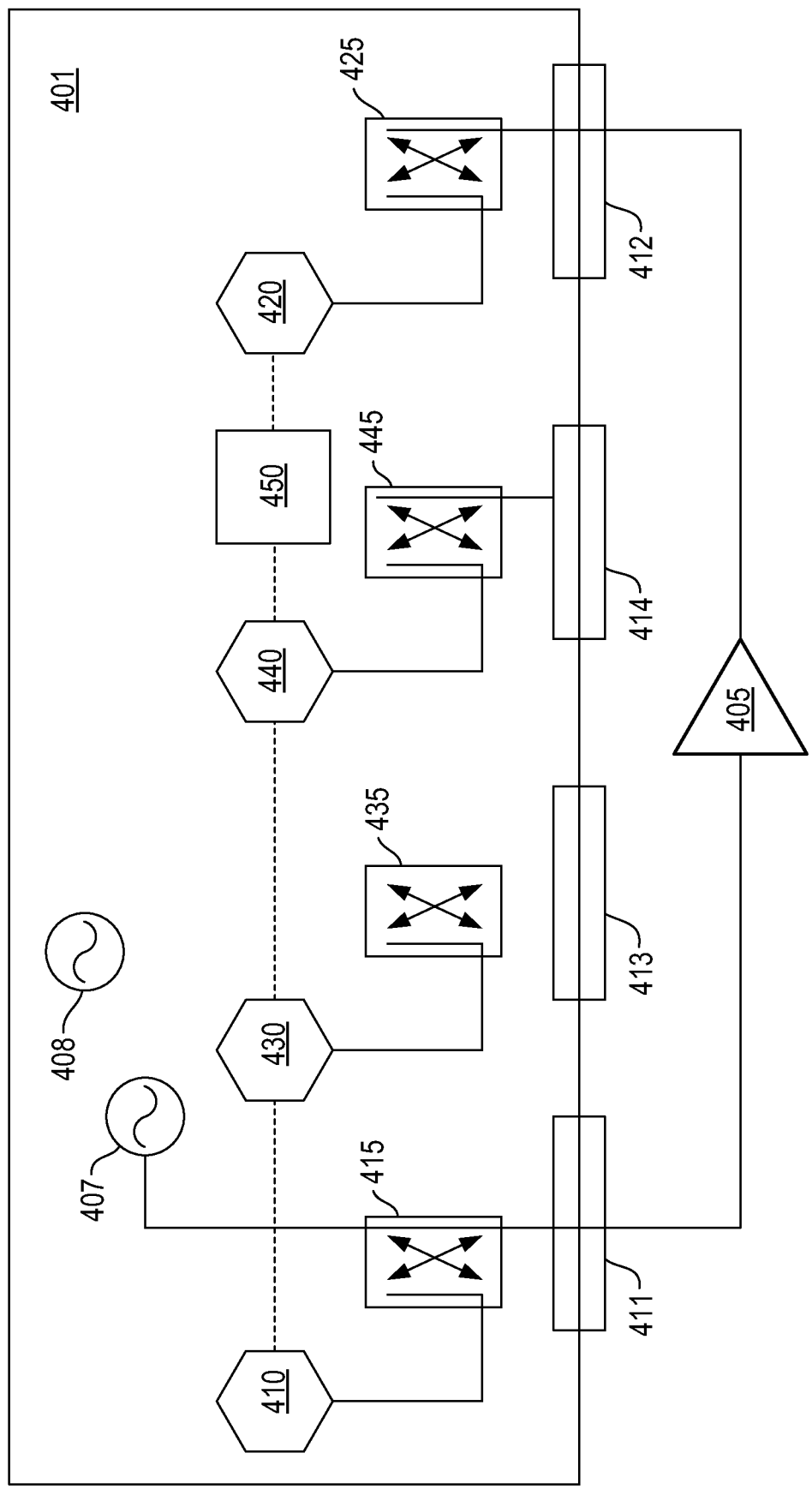
FIG. 8 is a simplified block diagram illustrating a system for measuring residual phase noise of a DUT, according to another representative embodiment.

FIG. 8 is a simplified block diagram illustrating a system for measuring residual phase noise of a DUT, according to a representative embodiment.

Referring to FIG. 8, system 800 includes illustrative VNA 401, which is substantially the same as VNA 401 depicted above in FIG. 4. The VNA 401 may be a PNA N522xA network analyzer or a PNA-X N524xA network analyzer, for example, available from Agilent Technologies, Inc. FIG. 8 depicts one illustrative implementation, and it is otherwise understood that the various components and functions may be implemented using any type of signal generator and/or measurement receiver, such as a two test port network analyzer, a vector spectrum analyzer, an oscilloscope, and the like.

For purposes of discussion, it is assumed that the signal source 407 of the VNA 401 provides a stimulus signal to an input of the DUT 405, although the signal source 408 is also capable of providing the stimulus signal. The output signal output by the DUT 405 in response to the stimulus signal includes the same carrier as the stimulus signal, as well as residual phase noise introduced by the DUT 405 in response to the stimulus signal, discussed below. Of course, in alternative embodiments, the signal source 408 may generate the stimulus signal and the driving signal.

In the depicted example, the stimulus signal is input to the DUT 405 via first test port 411 and measured by the receiver 410 via coupler 415. The output signal output by the DUT 405 is received and measured by the receiver 420 via second test port 412 and coupler 425. An attenuator (not shown) may be included in the signal path between the DUT 405 and the receiver 420, in case attenuation is desired. The receivers 410 and 420 are thus able to measure characteristics of the stimulus and output signals, respectively, including phase and magnitude. As discussed above, the output signal indicates the response of the DUT 405 to the stimulus signal provided by the signal source 407. The receivers 410 and 420 provide the respective measurements to the controller 450. It is understood that receivers 410 and 420 are identified for purposes of explanation, and that the stimulus and output signals may be received and sampled by any other internal receiver(s) via corresponding test ports, without departing from the scope of the present teachings.

Using channel 1 of the VNA 401 in the depicted configuration, a swept frequency measurement is setup with the carrier frequency of interest of the stimulus signal at the center of the span, where the span set to twice the span of interest for the final residual phase noise measurement. A trace of the forward gain S-parameter $S_{21}$ is setup in channel 1, and a standard two-port S-parameter and source/receiver power calibration is performed at the port reference planes of the DUT 405. With this calibration, a corrected S-parameter $S_{21}$ is measured in order to determine the actual gain of the DUT 405. Since S21 is the ratio of b2 and a1, where a1 is the stimulus signal (incident wave) at the input of the DUT and b2 is the output signal (transmitted wave) from the DUT 405, corrected a1 and b2 powers are also provided by the calibration.

Meanwhile, in order to measure the respective power spectrums of the stimulus signal (a1) and the output signal (b2), channel 2 of the VNA 401 is setup similarly to channel 1. Using the same corrections obtained for channel 1, the FOM is turned on and the signal source 407 on the first test port 411 is set to a CW frequency at the center of the span. The receivers 410 and 420 are allowed to sweep over the full span of channel 2. Accordingly, the a1 and b2 signals (both of which are corrected) are measured in channel 2, where the a1 and b2 signals are phase coherent since they are generated from the same signal source 407. As discussed above, the b2 signal is the a1 signal amplified and delayed by the DUT 405, and the b2 signal contains the effects of any phase noise and other non-linear effects added by the DUT 405. To minimize the error due to the non-linear effects, the level of the a1 signal is adjusted, so that the DUT 405 operates well inside its linear region of operation. Given this relationship between the a1 and b2 signals, if the a1 signal were to be amplified and delayed the same as the b2 signal, and then subtracted from the b2 signal, the remaining signal would be the additive noise power of the DUT 405.

The forward gain S-parameter $S_{21}$ has been measured in channel 1, which contains both amplification and delay information about the DUT 405. Accordingly, the controller 850 is able to calculate the residual noise power using the forward gain S-parameter $S_{21}$ and the a1 and b2 signals measured by the receivers 410 and 420, respectively, e.g., using Equation (1), above. The controller 850 is also able to calculate the corresponding residual phase noise by normalizing the residual noise power, e.g., using Equation (2), above.

Figure 9:
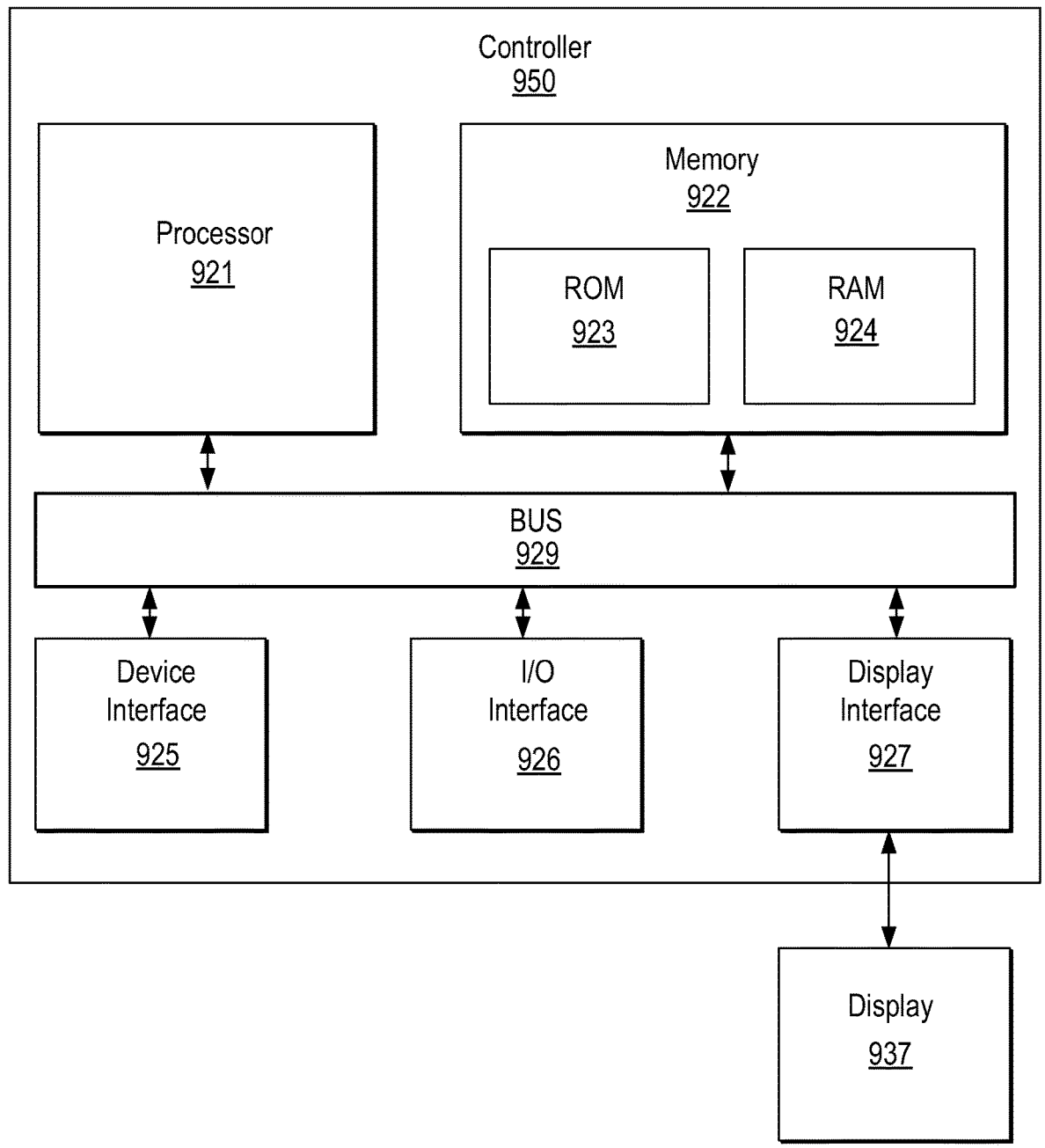
FIG. 9 is a functional block diagram showing an illustrative computer system for implementing emulation of a radio scene, according to a representative embodiment.

FIG. 9 is a functional block diagram showing an illustrative controller 950 that executes all or a portion of a process for measuring residual phase noise in a signal output by a DUT, according to a representative embodiment. The controller 950 may perform the various functions of the processors 250, 650 and controllers 450, 850, discussed above with reference to FIGS. 2, 4, 6, and 8, for example. The various "parts" shown in the controller 950 may be physically implemented using a software-controlled microprocessor, e.g., processor 921, hard-wired logic circuits, firmware, or a combination thereof. Also, while the parts are functionally segregated in the controller 950 for explanation purposes, they may be combined variously in any physical implementation.

In the depicted embodiment, the controller 950 includes processor 921, memory 922, bus 929 and various interfaces 925-927. The processor 921 executes the method(s) for measuring residual phase noise described herein (e.g., including the various operations of FIG. 3), in conjunction with the memory 922. The processor 921 may be constructed of any combination of hardware, firmware or software architectures, and include its own memory (e.g., non-volatile memory) for storing executable software/firmware executable code that allows it to perform the various functions. Alternatively, the executable code may be stored in designated memory locations within memory 922, discussed below. In an embodiment, the processor 921 may be a central processing unit (CPU), for example, executing an operating system, which may also control execution of other programs of the controller 950.

The memory 922 may be any number, type and combination of nonvolatile read only memory (ROM) 923 and volatile random access memory (RAM) 924, and stores various types of information, such as computer programs and software algorithms executable by the processor 921 (and/or other components), e.g., to perform residual phase noise measurements of the embodiments described herein. As generally indicated by ROM 923 and RAM 924, the memory 922 may include any number, type and combination of tangible computer readable storage media, such as disk drive, an electrically programmable read-only memory (EPROM), an electrically erasable and programmable read only memory (EEPROM), a CD, a DVD, a universal serial bus (USB) drive, and the like. Further, the memory 922 may store the predetermined boundaries one or more enterprise networks, as discussed above.

In an embodiment, a user (and/or other computers) may interact with the controller 950 using various input device(s) through I/O interface 926. The input devices may include a keyboard, key pad, a track ball, a mouse, a touch pad or touch-sensitive display, and the like. Also, various information may be displayed on a display 937 through display interface 927. Further, the controller 950 may interface with and otherwise control various devices, such as representative second signal source 202 in FIG. 2 and signal generator 460 in FIG. 4, through device interface 925, which communicates with the processor 921 and/or the memory 922 via bus 929.

According to various embodiments, measurements of residual phase noise of a DUT may be made with minimal test instrumentation, such as a vector signal generator and a VNA, for example. The measurements therefore may be as broadband as the frequency range of these two instruments. Also, carrier suppression is performed mathematically (e.g., by a processor or controller) and therefore none of the limitations attributed to the use of mixers as phase detectors applies. The only detectors required are the receivers used for receiving the output signal from the DUT and the reference signal used for suppressing the carrier of the output signal. Thus, the only power level consideration is to avoid compressing the receivers.

The various embodiments do not require additional calibration steps. There is only a signal conditioning step, in which phase and magnitude of the reference signal are adjusted to provide proper phase and magnitude ratios (e.g., as read on the VNA). Also, the various embodiments are relatively easy to automate. Other attributes of the DUT, such as gain, return loss, noise figure, intermodulation distortion (IMD) and compression may be measured using the same or similar hardware configuration.

While specific embodiments are disclosed herein, many variations are possible, which remain within the concept and scope of the invention. Such variations would become clear after inspection of the specification, drawings and claims herein. The invention therefore is not to be restricted except within the scope of the appended claims.

What is claimed is:

1. A system for measuring residual phase noise of a device under test (DUT), the system comprising:
   at least one signal source configured to generate a stimulus signal to be input to the DUT and to generate a reference signal that is phase coherent with the stimulus signal;
   a first receiver configured to receive and measure an output signal from the DUT that is responsive to the stimulus signal and to output a measurement of the output signal;
   a second receiver configured to receive and measure the reference signal from a signal source of the at least one signal source and to output a measurement of the reference signal; and
   a computer processor programmed to receive the measurement of the output signal from the first receiver and the measurement of the reference signal from the second receiver, to compute a difference between the measurement of the output signal and the measurement of the reference signal so as to computationally suppress a carrier of the output signal based on the computed difference, thereby providing the residual phase noise of the DUT.

2. The system of claim 1, wherein the computer processor is further programmed to adjust, based upon phase and magnitude measurements within the received measurement of the output signal and phase and magnitude measurements within the received measurement of the reference signal, a phase and a magnitude of the reference signal at the at least one signal source, such that the phase of the reference signal is about 180 degrees out of phase with a phase of the output signal and a magnitude of the reference signal is sufficiently equal to a magnitude of the output signal to cancel the carrier of the output signal.

3. The system of claim 1, wherein the first and second receivers are swept over a specified span, centered at a carrier frequency of the output signal, while keeping the carrier frequency fixed.

4. The system of claim 3, wherein an IF bandwidth of each of the first and second receivers is set an order of magnitude smaller than the specified span, and a number of frequency points in each sweep is set such that point spacing is half the IF bandwidth or less.

5. The system of claim 2, wherein the at least one signal source comprises IQ modulation functionality, and is further configured to download an IQ file generated by the computer processor for shifting the phase of the reference signal to be about 180 degrees out of phase with the phase of the output signal via the IQ modulation functionality.

6. The system of claim 1, wherein a signal source of the at least one signal source, the first receiver, the second receiver and the computer processor are internal to a vector network analyzer.

7. The system of claim 6, wherein a signal source of the at least one signal source is external to the vector network analyzer.

* * * * *